US006899928B1

(12) United States Patent
Groves et al.

(10) Patent No.: US 6,899,928 B1
(45) Date of Patent: May 31, 2005

(54) DUAL ION BEAM ASSISTED DEPOSITION OF BIAXIALLY TEXTURED TEMPLATE LAYERS

(75) Inventors: James R. Groves, Los Alamos, NM (US); Paul N. Arendt, Los Alamos, NM (US); Robert H. Hammond, Los Altos, CA (US)

(73) Assignee: The Regents of the University of California, Los Alamos, NM (US)

( * ) Notice: Subject to any disclaimer, the term of this patent is extended or adjusted under 35 U.S.C. 154(b) by 0 days.

(21) Appl. No.: 10/208,086

(22) Filed: Jul. 29, 2002

(51) Int. Cl.⁷ .......................... C23C 14/18; C23C 14/48; C23C 14/24; C30B 28/14
(52) U.S. Cl. ...................... 427/529; 427/564; 427/523; 117/92; 117/103; 117/108
(58) Field of Search ................................ 427/523, 527, 427/528, 529, 564; 117/92, 103, 108

(56) References Cited

U.S. PATENT DOCUMENTS

| | | | | | |
|---|---|---|---|---|---|
| 5,206,213 | A | * | 4/1993 | Cuomo et al. | 505/410 |
| 5,432,151 | A | * | 7/1995 | Russo et al. | 505/474 |
| 5,872,080 | A | * | 2/1999 | Arendt et al. | 505/238 |
| 6,190,752 | B1 | * | 2/2001 | Do et al. | 428/141 |
| 6,498,549 | B1 | * | 12/2002 | Jiang et al. | 333/202 |
| 6,537,689 | B2 | * | 3/2003 | Schoop et al. | 428/701 |
| 6,649,570 | B2 | * | 11/2003 | Belouet | 505/237 |
| 6,743,292 | B2 | * | 6/2004 | Jia et al. | 117/108 |
| 6,809,066 | B2 | * | 10/2004 | Reade et al. | 505/411 |
| 2002/0157601 | A1 | * | 10/2002 | Iijima et al. | 117/94 |
| 2003/0094598 | A1 | * | 5/2003 | Storer et al. | 252/500 |
| 2003/0148066 | A1 | * | 8/2003 | Reade et al. | 428/141 |
| 2003/0207043 | A1 | * | 11/2003 | Fritzemeier et al. | 427/551 |
| 2004/0168636 | A1 | * | 9/2004 | Savvides et al. | 118/723 CB |

OTHER PUBLICATIONS

Arendt et al, "Biaxially Textured IBAD–MgO Templates for YBCO–Coated Conductors", MRS Bulletin, Aug. 2004, p. 543–550.*
Iijima et al, "Research and Development of Biaxially Textured IBAD–GZO templates for Coated Superconductors", MRS Bulleti Aug. 2004, p. 564–571.*
Dong et al, "combined out–of–plane and in–plane texture control in thin films using ion beam assisted deposition", J. Material Research, vol. 16, No. 1, Jan. 2001, p. 210–216.*
Kingery et al, Introduction to Ceramics, 2nd ed., A Wiley–Interscience Publication, John Whiley & Sons, N.Y., 1976, no month –excerpt p. 61–63.*
Berry et al, Mineralogy: Concepts, Descriptions, Determinations: W.H. Freeman & Comp., San Francisco, 1959 no month,—excerpts p. 389–398.*

* cited by examiner

Primary Examiner—Marianne Padgett
(74) Attorney, Agent, or Firm—Bruce H. Cottrell

(57) ABSTRACT

The present invention is directed towards a process and apparatus for epitaxial deposition of a material, e.g., a layer of MgO, onto a substrate such as a flexible metal substrate, using dual ion beams for the ion beam assisted deposition whereby thick layers can be deposited without degradation of the desired properties by the material. The ability to deposit thicker layers without loss of properties provides a significantly broader deposition window for the process.

6 Claims, 4 Drawing Sheets

DIBAD deposition schematic

Fig. 1. IBAD MgO template architecture
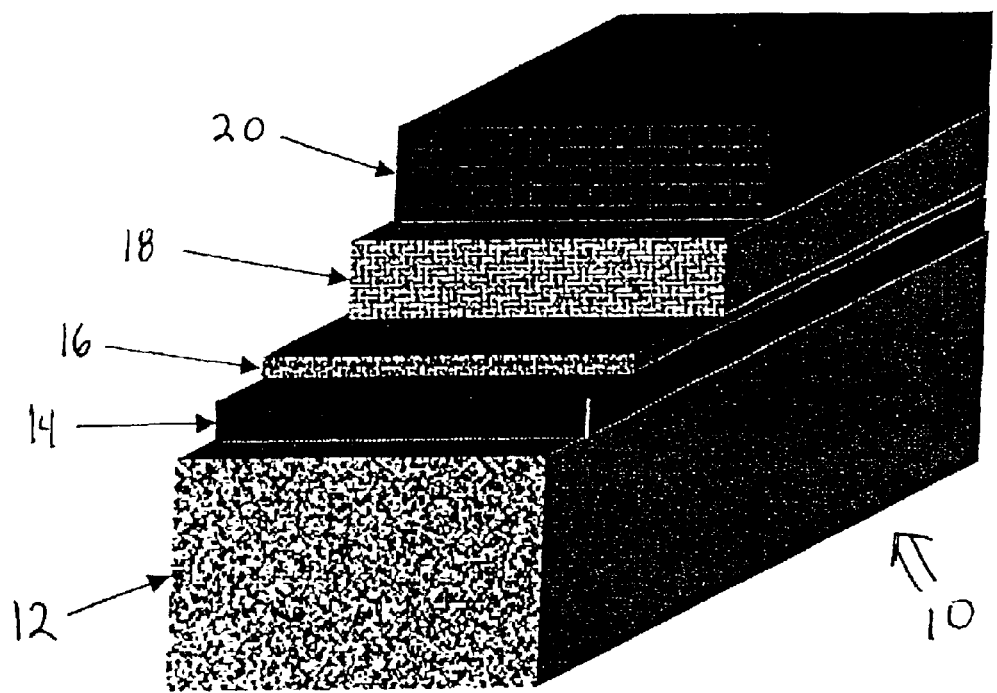

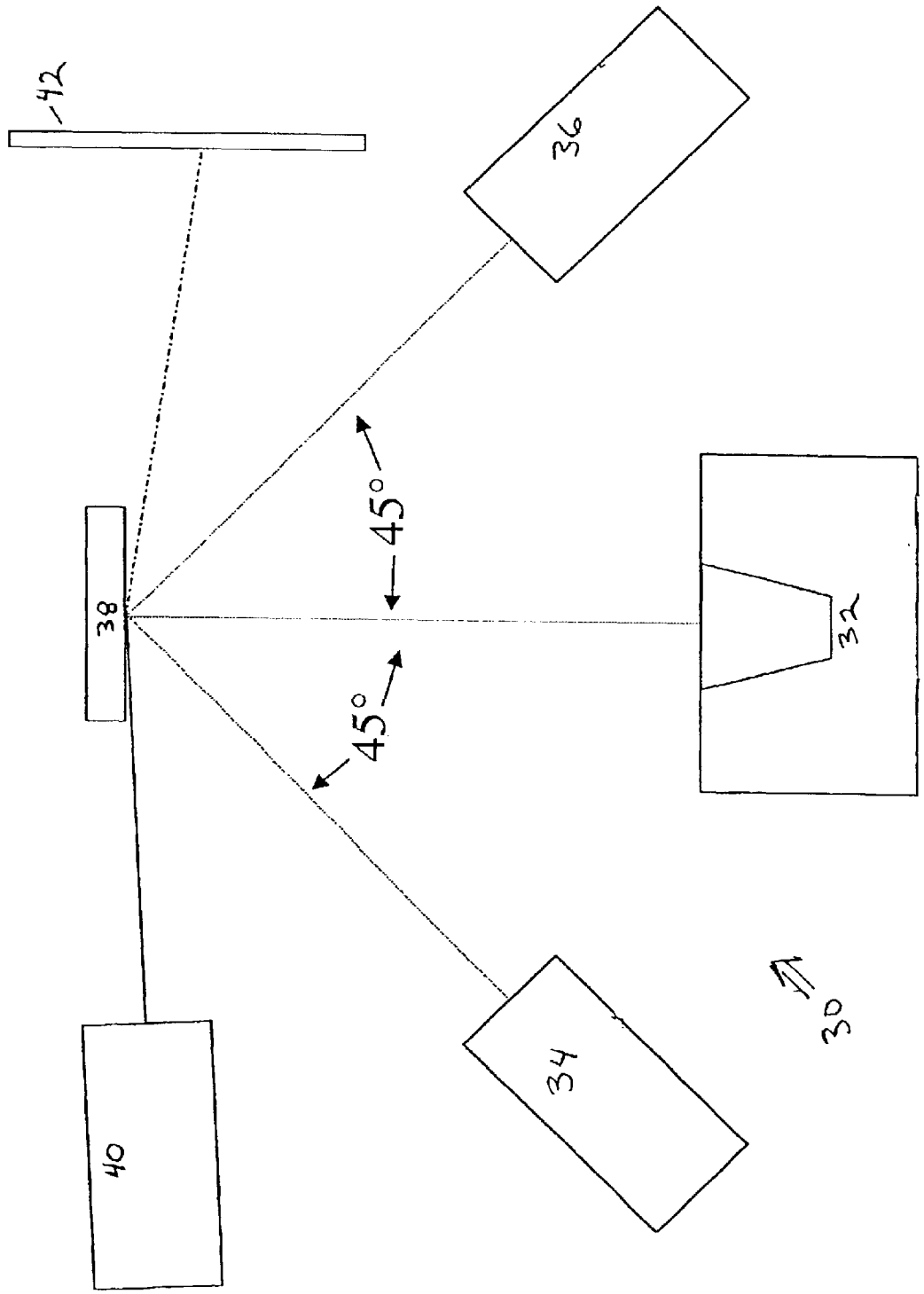
Fig. 2. DIBAD deposition schematic

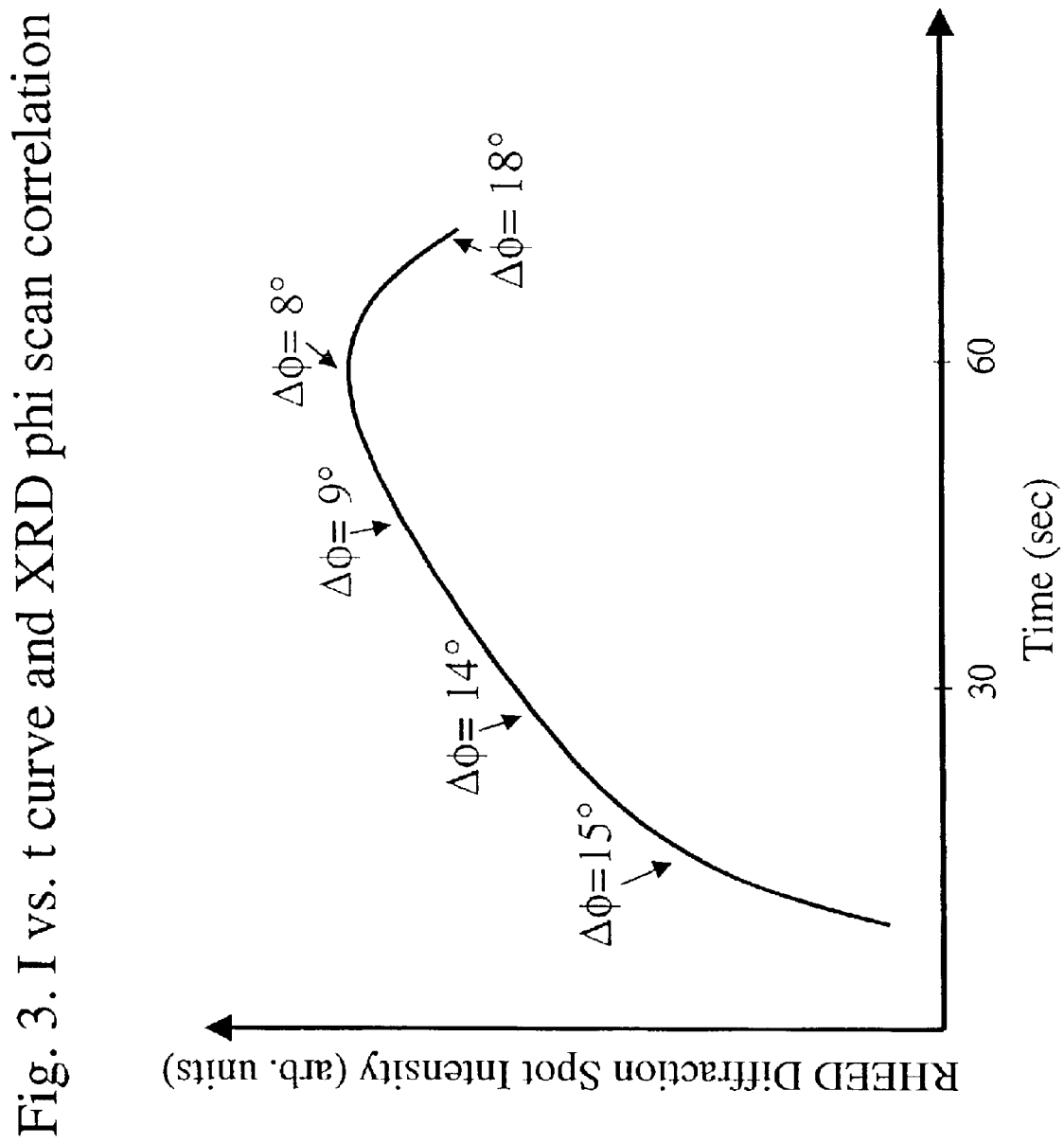
Fig. 3. I vs. t curve and XRD phi scan correlation

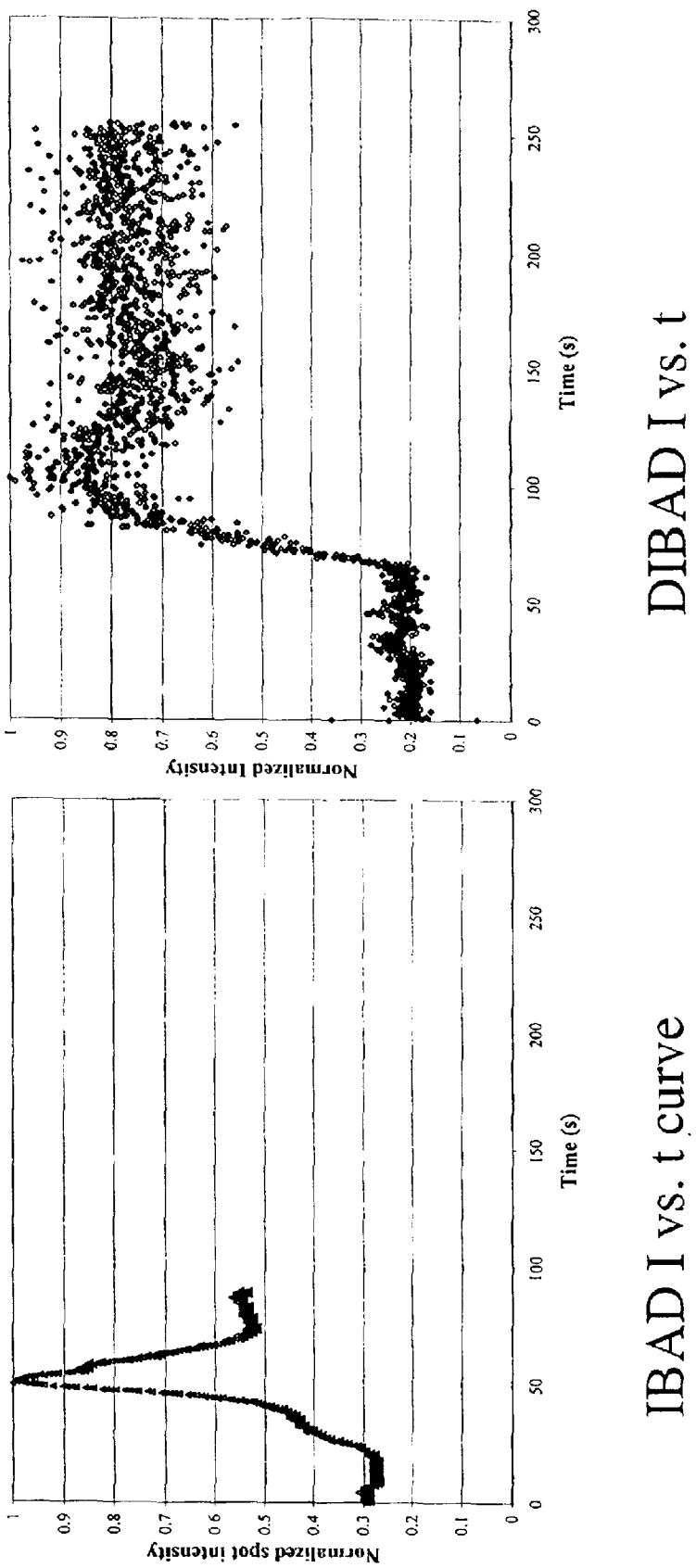
Fig. 4. Comparison of I vs t curves from IBAD and DIBAD

DUAL ION BEAM ASSISTED DEPOSITION OF BIAXIALLY TEXTURED TEMPLATE LAYERS

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates to a process and apparatus for the preparation of bi-axially textured template layers for coated conductor type superconductors.

BACKGROUND OF THE INVENTION

There is great interest in the high temperature superconductor (HTS) coated conductor community to develop economically scalable processes for fabricating bi-axially textured templates on which high quality $YBa_2Cu_3O_{7-\Delta}$ (YBCO) can be heteroepitaxially deposited. In order to achieve good superconducting properties, YBCO grains require good alignment between each other to obtain high (>1 $MA/cm^2$) critical current densities ($J_c$). The two competitive processes to produce the bi-axial texture required by YBCO have been Roll-Assisted BI-axial Texturing of Substrates (RABITS) and Ion-Beam Assisted Deposition (IBAD).

The latter technique has been used in the development of IBAD deposited yttria-stabilized zirconia (YSZ) for coating meaningful lengths on commercially important metal substrates. Further efforts have resulted in development of a process, coupled with pulsed laser deposition (PLD) YBCO, that has produced meter lengths of superconducting wire with critical current densities over 1 $MA/cm^2$ and critical currents over 100 A. Despite these results, one criticism of the IBAD-YSZ process has been that the time required to deposit the material with sufficient in-plane texture for high quality YBCO is too long. In order to develop texture, YSZ requires a thickness of between 0.5 and 1 micrometer ($\mu m$) to achieve a $\Delta\phi$ (or full width at half maximum of the $\phi$-scan peak) better than 12°. Reported IBAD deposition times have ranged from about one to twelve hours per meter of tape. Thus, the viability of this process has been questionable for cost efficient, industrial fabrication.

Subsequently, it has been shown that magnesium oxide (MgO) can be deposited with the IBAD process and produce a thin film with in-plane texture comparable to YSZ that was only 10 nanometers (nm) thick. This translates to a process about 100 times faster than IBAD YSZ. This process has been applied to further development in the preparation of FITS coated conductors. For example, short length samples (less than about 4 cm long) using IBAD MgO templates have been produced with $J_c$s over 1 $MA/cm^2$ (77 K) for >1.5 $\mu m$ thick YBCO films.

However, IBAD MgO still has some drawbacks that detract from its viability as a template layer for long length processing of coated conductors. The two most detrimental limitations are (1) the degradation of in-plane texture as IBAD MgO film thickness increases beyond a critical thickness of 10 nm; and, (2) the necessity to deposit IBAD MgO films on very smooth (<2 nm rms) substrates.

Dong et al., Journal of Materials Research, vol. 16, pp. 210–216 (2001), have suggested a dual ion beam approach for control of texture in aluminum films, but contain no hint of the applicability to the deposition of MgO films for the subsequent deposition of thin films such as YBCO.

After extensive and careful investigation, the present inventors have now developed an IBAD deposition process using dual ion beams in deposition of intermediate layers for the subsequent deposition of thin films such as YBCO.

SUMMARY OF THE INVENTION

In accordance with the purposes of the present invention, as embodied and broadly described herein, the present invention provides a process of forming composite structures having a layer of oriented MgO for subsequent deposition of other epitaxially oriented (either hetero or homo) layers, the process including depositing an amorphous layer of an oxide, a nitride or an oxynitride material by dual ion beam assisted deposition upon the surface of a substrate, and, depositing a layer of an oriented cubic oxide material having a rock-salt-like structure upon the amorphous oxide, nitride, or oxynitride material layer, the layer of oriented cubic oxide material having a thickness of from about 20 nm to about 50 nm and having a full width at half maximum $\phi$-scan peak of less than about 14°.

Further, the present invention provides an apparatus for deposition of a layer of a target material upon a buffered polycrystalline metal substrate by dual ion beam assisted deposition, the target material layer having a thickness of from about 20 nm to about 50 nm and having a full width at half maximum $\phi$-scan peak of less than about 14°, the apparatus including a substrate holder, a first ion gun for ion beam assisted deposition of a target material, said first ion gun having an incidence angle of 45° relative to a substrate, a second ion gun for ion beam assisted deposition of a target material, said second ion gun having an incidence angle of 45° relative to a substrate and 90° relative to said first ion gun, and, a source for providing the target material. In a preferred embodiment, the target material is MgO. The apparatus can further include a temperature controller for heating or cooling of the substrate during deposition.

BRIEF DESCRIPTION OF THE FIGURES

FIG. 1 shows a schematic structure of a template architecture prepared in the process of the present invention.

FIG. 2 shows a schematic diagram of an apparatus of the present invention.

FIG. 3 shows a plot of Reflected High-Energy Electron Diffraction (RHEED) diffraction spot intensity versus time and X-ray diffraction (XRD) $\phi$ scan correlation for films prepared by the process and apparatus of the present invention.

FIGS. 4(a) and 4(B) show a comparison of normalized intensity versus time curves for both an IBAD prepared film (4a) and a DIBAD prepared film (4b).

DETAILED DESCRIPTION

An improvement in IBAD technique for development of bi-axial texture in magnesium oxide (MgO) for use in heteroepitaxial deposition of HTS YBCO has now been demonstrated. For distinction between processes, the acronym for the two-gun process in the following description is DIBAD (dual ion-beam assisted deposition). The prior process, i.e., the IBAD process used a single ion beam that irradiates a sample surface with low energy (<1000 eV) inert gas ions concurrently with the vapor deposition of a source material. In contrast, the present invention employs two ion beams in conjunction with the vapor source deposition.

The result of using two ion guns is to eliminate the effect of texture degradation beyond the critical thickness of about 10 nm observed in single IBAD MgO. It has been observed that IBAD MgO shows a distinct behavior in the development of in-plane texture. A detailed study by the present inventors has confirmed the observation of Wang et al., "Ion-beam-induced Texturing in Oxide Thin Films and its Applications", in Materials Science and Engineering, Stanford: Stanford University, 1999, pp.113, that texture degradation begins to occur after about 10 nm of IBAD MgO is deposited.

While not wishing to be bound by the present explanation, it is believed that the mechanism of texture degradation is as follows. As the thickness of a deposited film increases beyond the critical amount (about 10 nm), the accumulated dislocation density increases along the ion beam incident direction and begins to tilt the crystal planes away from the ion beam. Further deposition exacerbates this effect and results in degradation of bi-axial texture for the film. By use of DIBAD, it is believed that reducing the degrees of freedom available to dislocation generation and movement along these specific planes can mitigate the effect.

Monitoring the change in bi-axial orientation of the IBAD MgO film during growth may be accomplished using Reflected High-Energy Electron Diffraction (RHEED). In such a process, the spot intensity varies as a function of IBAD MgO film thickness. The maximum spot intensity has been observed at a thickness of about 10 nm. Additional analysis has determined a correlation between in-plane texture and the spot intensity by comparing different film thicknesses at points in time before, at, and beyond the observed maximum spot intensity. The best in-plane texture was obtained at the maximum spot intensity and degraded rapidly beyond that point. This degradation is shown in FIG. 3. A similar study was conducted for DIBAD MgO samples and no degradation was observed for films with thicknesses greater than 10 nm. The effect of DIBAD can be most readily observed by examining the difference between spot intensity versus time curves as shown in FIG. 4. DIBAD MgO films have been deposited with $\Delta\phi=9°$ without process optimization. This is a significant improvement over conventional IBAD MgO processing where the processing window for good in plane texture ($\Delta\phi=8$ to $10°$) may be only several seconds in width and difficult to predict.

Another main concern for conventional IBAD processing of MgO has been the need for ultra-smooth (<2 nm root mean square (RMS)) surfaces to improve in-plane texture. It had been previously demonstrated that decreased surface roughness decreased in-plane misorientation and increased subsequent YBCO $J_c$ values (Groves et al., "Development of the IBAD MgO Process for HTS Coated Conductors", Proc. Int. Workshop on Superconductivity, Honolulu, Hi., p. 43 (2001)). While just increasing the thickness of the IBAD MgO layer would seem to overcome this limitation in the IBAD process, conventional IBAD MgO texture degrades as the thickness is increased beyond about 10 nm. It has now been found that this problem can be overcome by using the DIBAD process. Presently, metal tapes that have been mechanically polished with a 1 micron or finer diamond paste for a short time period of from about 10 seconds to about 20 seconds to get the surface roughness to about 4 nm to about 6 nm RMS have been used as substrates for DIBAD MgO deposition with good results.

Initial results of subsequently deposited YBCO on these DIBAD MgO based templates are good. The substrate used was a Hastelloy C276 high temperature Ni-alloy substrate. Silicon nitride was deposited as an amorphous layer as taught by Do et al. in U.S. Pat. No. 6,190,752. A layer of MgO was then deposited by DIBAD upon the silicon nitride to a thickness of about 40 nm without any degradation of the MgO layer. The superconducting transition temperature ($T_c$) was measured as 88.1 K. X-ray $\phi$-scans of the YBCO had a $\Delta\phi$ of 13.7° with a low background count. Four microbridges were patterned on the substrate and the measurements for the critical current density ($J_c$) as well as the YBCO thickness are summarized in Table 1. A typical architecture is shown in FIG. 1 where the article 10 includes a polycrystalline metal substrate 12, an amourphous nucleation layer 14, an IBAD MgO layer 16, a pulsed laser deposition buffer layer 18, and a superconducting layer 20. A homo-epitaxial layer of MgO can be deposited onto the IBAD MgO layer 16 before buffer layer 18.

TABLE 1

| Bridge | YBCO thickness ($\mu$m) | $J_c$ (MA/cm$^2$) |
|---|---|---|
| A | 0.90 | 0.22 |
| B | 0.70 | 0.20 |
| C | 0.64 | 0.26 |
| D | 0.73 | 0.31 |

The present invention presents an improved approach to the deposition of bi-axially textured MgO thin films using ion-beam-assisted deposition. This process (DIBAD) uses two ion guns and a vapor source to produce a bi-axially oriented MgO template layer for the deposition of subsequent layers. The DIBAD process eliminates several problems with the standard single gun IBAD deposition of MgO. First, degradation of in-plane texture after a critical thickness does not occur with DIBAD as it does with IBAD. Secondly, the thickness of the film can be increased substantially (up to at least 5 times) beyond the critical thickness observed for IBAD MgO films thereby providing an industrially important longer processing window. Also, initially DIBAD deposited MgO films subsequently overcoated with YBCO have demonstrated high Tc values and fairly good $J_c$ values.

In the present invention, the initial or base substrate can be, e.g., any polycrystalline material such as a metal or a ceramic such as polycrystalline aluminum oxide or polycrystalline yttria-stabilized zirconia (YSZ). Preferably, the substrate can be a polycrystalline metal such as nickel. Alloys including nickel such as various Hastelloy metals, Haynes metals and Inconel metals are also useful as the substrate. The metal substrate on which the superconducting material is eventually deposited should preferably allow for the resultant article to be flexible whereby superconducting articles (e.g., coils, motors or magnets) can be shaped. As such a metal substrate can have a rough surface, it had previously required much mechanical polishing, electrochemical polishing or chemical mechanical polishing to provide a smoother surface (less than about 2 nm RMS) prior to IBAD deposition. With DIBAD such a high degree of polishing is generally not needed. Substrates with 4 nm RMS have been successfully used.

Whether the metal substrate is polished or not, a layer of an inert material can be deposited upon the base substrate. By "inert" is meant that this material does not react with the base substrate or with any subsequently deposited materials. Examples of suitable inert materials include aluminum oxide ($Al_2O_3$), yttrium oxide ($Y_2O_3$), silicon nitride ($Si_3N_4$), and aluminum oxynitride (AlON). The inert layer can be deposited on the base substrate by pulsed laser deposition, e-beam evaporation, sputtering or by any other suitable means. The layer is deposited at temperatures of generally greater than about 400° C.

The ion source gas in the DIBAD process, i.e., the dual ion beam assisted deposition can be any inert gas but is preferably argon. The dual ion beam assisted deposition is conducted with substrate temperatures of generally from about 20° C. to about 100° C. A MgO layer deposited by the DIBAD process can generally be from about 20 nm to about 80 nm in thickness, preferably about 20 nm to about 50 nm.

After deposition of the MgO (or other oriented cubic oxide materials having a rock-salt-like structure), an additional thin homo-epitaxial layer of the same material can be optionally deposited by a process such as electron beam or magnetron sputter deposition. This thin layer can generally be about 25 nm in thickness. Deposition of the homo-epitaxial layer by such a process can be more readily accomplished than depositing the entire thickness by dual ion beam assisted deposition.

The present invention is more particularly described in the following example which is intended as illustrative only, since numerous modifications and variations will be apparent to those skilled in the art.

EXAMPLE 1

Magnesium oxide has a cubic rock-salt structure with a lattice constant of a=0.421 nm. In order to achieve bi-axial texture an amorphous layer can be deposited on a substrate surface.

The substrates used here were nickel-based alloys. Before deposition, the metal substrates were mechanically polished to an average surface roughness of 4 nm. An amorphous layer (about 5 nm) was deposited upon the substrate using electron beam deposition. A subsequent layer of MgO was deposited upon the amorphous layer using DIBAD. Argon ions were accelerated to 750 eV with a total current density of 100 $\mu$A/cm$^2$ using two Kaufman ion sources (each ion gun provides an individual current density of 50 $\mu$A/cm$^2$). The incidence angle of the ion sources was 45° relative to the substrate that corresponds to the MgO<110>. Concurrently, an electron beam evaporator provided the magnesium oxide vapor flux at 0.15 nm/s during DIBAD growth. The ion to atom ratio was maintained constant at 0.7. The vapor flux and the ion fluence were monitored with a quartz crystal microbalance (QCM) and a Faraday cup, respectively. All IBAD depositions were performed at room temperature.

IBAD film growth was monitored in situ using RHEED by collecting a spot intensity versus time (I vs. t) curve that used the reflections corresponding to the (002) and (022) planes. Images were captured using kSA400 software (k-Space Associates, Ann Arbor, Mich.). All patterns were taken at the beam energy of 30 keV. A schematic diagram used is shown in FIG. 2 of the apparatus 30 which includes source 32, first ion gun 34 and second ion gun 36 oriented at 90° from one another, a substrate 38, and RHEED gun 40 with phosphor screen 42 for displaying a diffraction image of the growing film on substrate 38.

Pulsed laser deposition (PLD) was then used to heteroepitaxially deposit subsequent buffer and YBCO layers. These depositions took place at substrate temperatures between 730° C. and 770° C. Two buffer layers were used in this sample. The first layer was 50 nm of YSZ followed by 20 nm of yttria. Both of these layers were deposited at a rate of 0.05 nm/s. These buffer layers were used to obtain improved lattice matching with the final YBCO films. The YBCO films were deposited at a rate of 2 nm/s. Metal samples were then patterned into micro-bridges with nominal dimensions of 250 $\mu$m wide by 5 mm long. Superconducting transition temperatures and transition widths were measured using an inductive probe. Transport critical current and critical current density were measured in liquid nitrogen temperature (75 K) and self-field using a0.1 $\mu$V/cm criterion.

Although the present invention has been described with reference to specific details, it is not intended that such details should be regarded as limitations upon the scope of the invention, except as and to the extent that they are included in the accompanying claims.

What is claimed is:

1. A process of forming a composite structure having a layer of oriented MgO for subsequent deposition of another heteroepitaxially oriented layer, said process comprising:

depositing a layer of an amorphous oxide, nitride or oxynitride material upon the surface of a substrate; and, depositing a layer of an oriented MgO by dual ion beam assisted deposition upon the amorphous oxide, nitride or oxynitride material layer, said dual ion beams with an energy of 750 eV and a total current density of 100 $\mu$A/cm$^2$ and said layer of MgO having a thickness of from about 20 nm to about 80 nm and having a full width at half maximum $\phi$-scan peak of less than about 14°.

2. The process of claim 1 wherein said layer of an amorphous oxide, nitride or oxynitride material is selected from the group consisting of silicon nitride, yttrium oxide, aluminum oxide and aluminum oxynitride.

3. The process of claim 1 wherein said layer of MgO has a thickness of from about 20 nm to 50 nm.

4. The process of claim 1 wherein said substrate is a flexible polycrystalline metal.

5. The process of claim 4 wherein said flexible polycrystalline metal has a root mean square (RMS) roughness of from about 2 nm to 6 nm.

6. The process of claim 4 wherein said flexible polycrystalline metal has a root mean square (RMS) roughness of from about 4 nm to 5 nm.

* * * * *